United States Patent [19]

Wermuth

[11] Patent Number: 4,758,797
[45] Date of Patent: Jul. 19, 1988

[54] AMPLIFIER WITH COMPRESSOR AND EXPANDER FUNCTION FOR GROUND SYMMETRICAL ELECTRICAL SIGNALS

[75] Inventor: Jürgen Wermuth, Peine, Fed. Rep. of Germany

[73] Assignee: ANT Nachrichtentechnik GmbH, Backnang, Fed. Rep. of Germany

[21] Appl. No.: 886,442

[22] Filed: Jul. 17, 1986

[30] Foreign Application Priority Data

Jul. 18, 1985 [DE] Fed. Rep. of Germany ....... 3525655

[51] Int. Cl.⁴ .......................... H03F 1/20; H03G 3/18
[52] U.S. Cl. ..................................... 330/149; 330/284
[58] Field of Search ...................... 330/149, 278, 284; 333/14; 328/145

[56] References Cited

U.S. PATENT DOCUMENTS 4,187,478 2/1980 Endoh et al. .................... 333/14
4,514,702 4/1985 Zogg .

FOREIGN PATENT DOCUMENTS 2071944 9/1981 United Kingdom .
2083984 3/1982 United Kingdom .
2114391 8/1983 United Kingdom .
2156175 3/1984 United Kingdom .
2133944 8/1984 United Kingdom .
2161663 7/1985 United Kingdom .

OTHER PUBLICATIONS

Tietze, Schenk, "Halbleiter-Schaltungstechnik", 2nd Edition Springer-Verlag, 1971, p. 282 et seq.

Primary Examiner—Gene Wan
Attorney, Agent, or Firm—Spencer & Frank

[57] ABSTRACT

An amplifier for ground symmetrical signals includes a compressor at the input and an expander at the output, with the slope of at least one of its expansion or compression characteristics being adjustable for at least one half-wave polarity with the aid of an adjustment voltage. In order to reduce second order distortions at the amplifier output, a circuit is provided for determining the arithmetic mean value of the voltage across the amplifier output. A control value is produced from the determined mean value and the slope of the expansion or compression characteristic is regulated with this control value in the opposite direction so that the distortions are reduced.

9 Claims, 2 Drawing Sheets

AMPLIFIER WITH COMPRESSOR AND EXPANDER FUNCTION FOR GROUND SYMMETRICAL ELECTRICAL SIGNALS

BACKGROUND OF THE INVENTION

The present invention relates to an amplifier with a compressor and an expander function for positive as well as negative half-waves of ground symmetrical signals with the slope of the compression or expander characteristic being controllable for at least one half-wave polarity.

The best known representative of such an amplifier with a compressor and expander function is the so-called VCA (voltage controlled amplifier). If it were required only for half-waves of one polarity, it could be composed of a circuit which produces an output equal to the logarithm of the input signal with a subsequently connected circuit which produces an output equal to the exponential power of its input signal, i.e., an antilog circuit, (see Tietze, Schenk, "Halbleiter-Schaltungstechnik" [Semiconductor Circuit Technology], 2nd Edition, published by Springer-Verlag, 1971, pages 282 et seq.). However, with such a circuit arrangement care would have to be taken that the slope of the compression and/or expansion characteristic is controllable. These characteristics represent the curve of the amplifier output level as a function of the input level.

FIG. 1 is a basic circuit diagram of such an amplifier for an input signal, which may have both half-wave polarities, at its input E, with the gain of the amplifier not being controllable. Between its input terminal E and a center terminal M, the amplifier has an instantaneous compressor with an approximately logarithmic gain characteristic. The compressor is composed of an operational amplifier 1 having a series input circuit composed of a coupling capacitor C1 and an input resistor R1, and a pair of feedback diodes D1, D2 connected in antiparallel. With the output voltage of operational amplifier 1 rising linearly in magnitude, a superproportional current, i.e. an exponentially increasing current, is returned via the feedback diodes D1 and D2 to the input of operational amplifier 1 so that greater amplitude values are amplified less than smaller values in the compressor.

In the subsequent instantaneous expander, which is disposed between center terminal M and amplifier output terminal A and which includes a pair of antiparallel connected diodes D3 and D4 connected in series with the input of an operational amplifier 2 having a feedback resistor R2, conditions are reversed. That is, in the expander, the currents through the input diodes D3 and D4, which increase exponentially with linearly increasing input voltage of the expander, are amplified by an operational amplifier 2 and its feedback resistance R2 and produce a correspondingly amplified output voltage across output terminals A.

To realize a controllable gain for the amplifier, the diodes D1–D4 of FIG. 1 are each replaced in FIG. 2 by the emitter-collector path of a respective transistor T1 to T4. More specifically, the diodes D1 and D2 of the compressor of FIG. 1 are replaced by a pair of opposite polarity type transistors T1 and T2 which have their respective emitters connected to the output of the operational amplifier 1 via respective resistors R3 and R4 and have their collectors connected together and to the inverting input of the operational amplifier 1. A source of operating potential is connected across the series connected emitter-collector paths of the transistors T1 and T2. The diodes D3 and D4 of the expander of FIG. 1, in turn, are replaced by a pair of opposite polarity type transistors T3 and T4 which are of the same polarity type as the transistors T1 and T2 respectively and which have their emitters connected to the respective emitters of the transistors T1 and T2 and their collectors connected together and to the inverting input of the operational amplifier 2. In order to control the slope of the compression and expansion characteristics of both the compressor and the expander for both half-waves polarities, the bases of transistors T1 and T4 are connected to ground via a resistor R5 and to a terminal 3, while the bases of transistors T2 and T3 are connected to ground via a resistor R6 and to a terminal 4; an adjustable d.c. voltage is applied to the pair of terminals 3–4.

In an emitter-collector path as shown in FIG. 2, the current through the transistor also rises exponentially with the linearly increasing emitter-base voltage as long as the associated base-collector voltage remains constant. If the potentials at the pair of adjustment terminals 3–4 are initially kept constant, the potential differences between the constant base potentials, on the one hand, and the half-wave shaped, pulsating emitter potentials, on the other hand, produce collector currents as an exponential function of the base-emitter voltages.

Controlling the gain is now possible in that an adjustment value (adjustment voltage) Us is applied to the pair of adjustment terminals 3–4, thus permitting the slope of the collector current/base-emitter voltage characteristic of each transistor to be varied because a change in potential at the bases causes a change in the collector-base voltage. It must here be considered that the potential at the collectors is almost zero because the collectors are each connected with one of the inverted inputs (so-called virtual zero points) of the respective operational amplifiers 1 and 2. In detail, the gain control operates such that, for example, an increase in potential at adjustment terminal 3 and a reduction at adjustment terminal 4 adjusts transistors T3 and T4 to conduct better and transistors T1 and T2 to conduct less well, with the result that the degree of expansion in the expander (2, R2, T3, T4) increases and the degree of compression occurring in the compressor (1, R1, T1, T2) decreases, so that the overall gain between input terminals E and output terminals A increases.

When an amplifier according to FIG. 2, or another amplifier for symmetrical signals with a compressor and/or expander function, is employed, second order distortions or harmonics may occur at the output although such distortions actually should not occur. The cause of these distortions is due to differences in behavior, sometimes as a function of temperature, of the two branches with respect to positive and negative half-waves.

To reduce such distortions, it is known to use selected pairs of transistors T1–T2 and T3–T4 with the individual transistors of each pair being thermally coupled together. This technique, however, requires undesirable expenditures.

Another way to reduce distortions is disclosed in Federal Republic of Germany DE-OS No. 3,021,788. According to this reference, behind input terminal E of FIG. 2 of the present application, a parallel path branches off for the symmetrical signals. In this parallel path a phase inverter amplifier is followed by a further circuit as shown in FIG. 2 which is then again followed by a further phase inverter amplifier before the output signals of the parallel path are added to the signals at output terminal A of FIG. 2. If now in FIG. 2, for example, the positive half-wave were given less preferential treatment (due to a weaker gain for transistor T3 than transistor T4), thus producing second order distortions, the inversion in the parallel path would put the other half-wave (through the transistor corresponding to T3) at a disadvantage. The addition at the output terminal A balances out the disadvantaged different half-waves (and thus the preferential treatment of the respectively other half-waves), presuming again that sufficient thermal couplings are provided.

SUMMARY OF THE INVENTION

It is an object of the present invention to provide an amplifier of the above type wherein distortions in the form of undesirable second harmonics in the output signal are reduced in such a manner that the accuracy of the thermal coupling is no longer so important.

The above object is accomplished according to the present invention by an amplifier with a compressor and expander function for positive and negative half-waves of ground symmetrical signals which comprises: a compressor circuit means, having its input connected to a signal input terminal, for compressing negative and positive half-waves of an input signal; expander circuit means, having its input connected to the output of the compressor circuit means and its output connected to an amplifier signal output terminal, for expanding positive and negative half-waves of an input signal; circuit means for applying a variable desired voltage to at least the expander or compressor circuit means to control the slope of the expansion or compression characteristic respectively for at least one half-wave polarity to control the gain of the amplifier; and control circuit means for reducing distortions in the output signal from the amplifier caused by even number harmonics including means, connected to the amplifier output terminal, for determining the arithmetic mean value of the signal at the amplifier output terminal and feeding a corresponding control value to the expander or compressor circuit means to change the slope of the expansion characteristic for the at least one half-wave polarity relative to the other half-wave polarity so as to reduce the distortions.

According to a feature of the invention the control circuit means includes adjustable means for superposing a desired constant value on the corresponding control value.

Preferably, the circuit means for applying a variable voltage is connected to the expander circuit means to control the slope of the expansion characteristic for both half-wave polarities, the control circuit means feeds the control value to the expander circuit means to simultaneously change the slope of the expansion characteristic for both half-wave polarities, and the control circuit means comprises an integrator having its input connected to the amplifier output terminal and its output connected to the expander circuit means to superpose the control value on the variable desired voltage.

DETAILED DESCRIPTION OF THE PREFERRED EMBODIMENT

Figure 2:
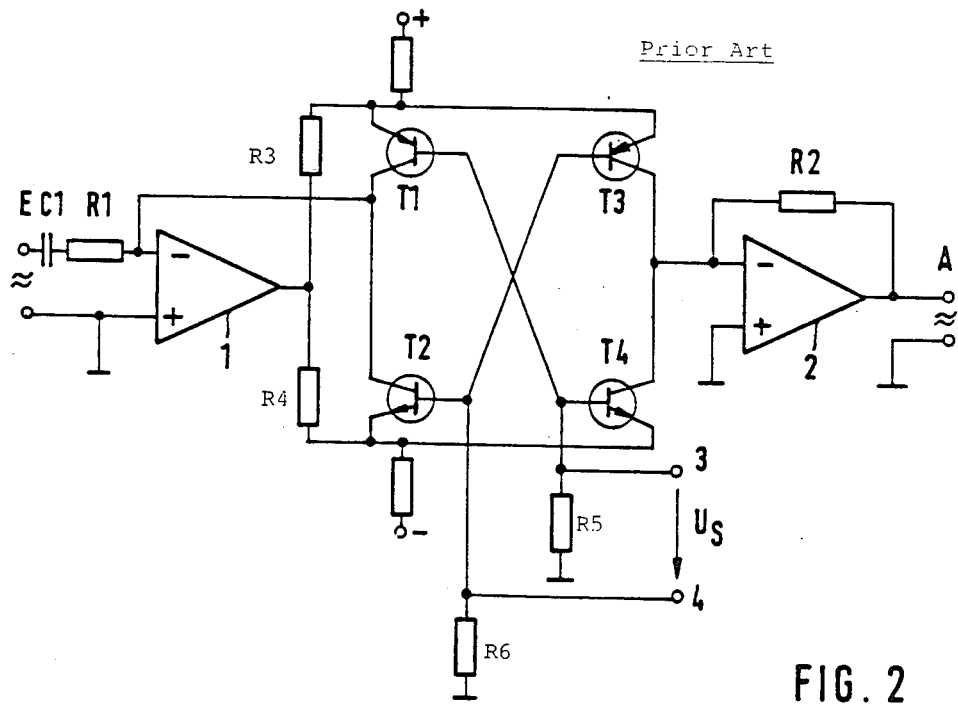
FIG. 2 is a circuit diagram of a voltage controlled amplifier according to the prior art having a compression/expansion function characteristic with controllable gain.
Figure 3:
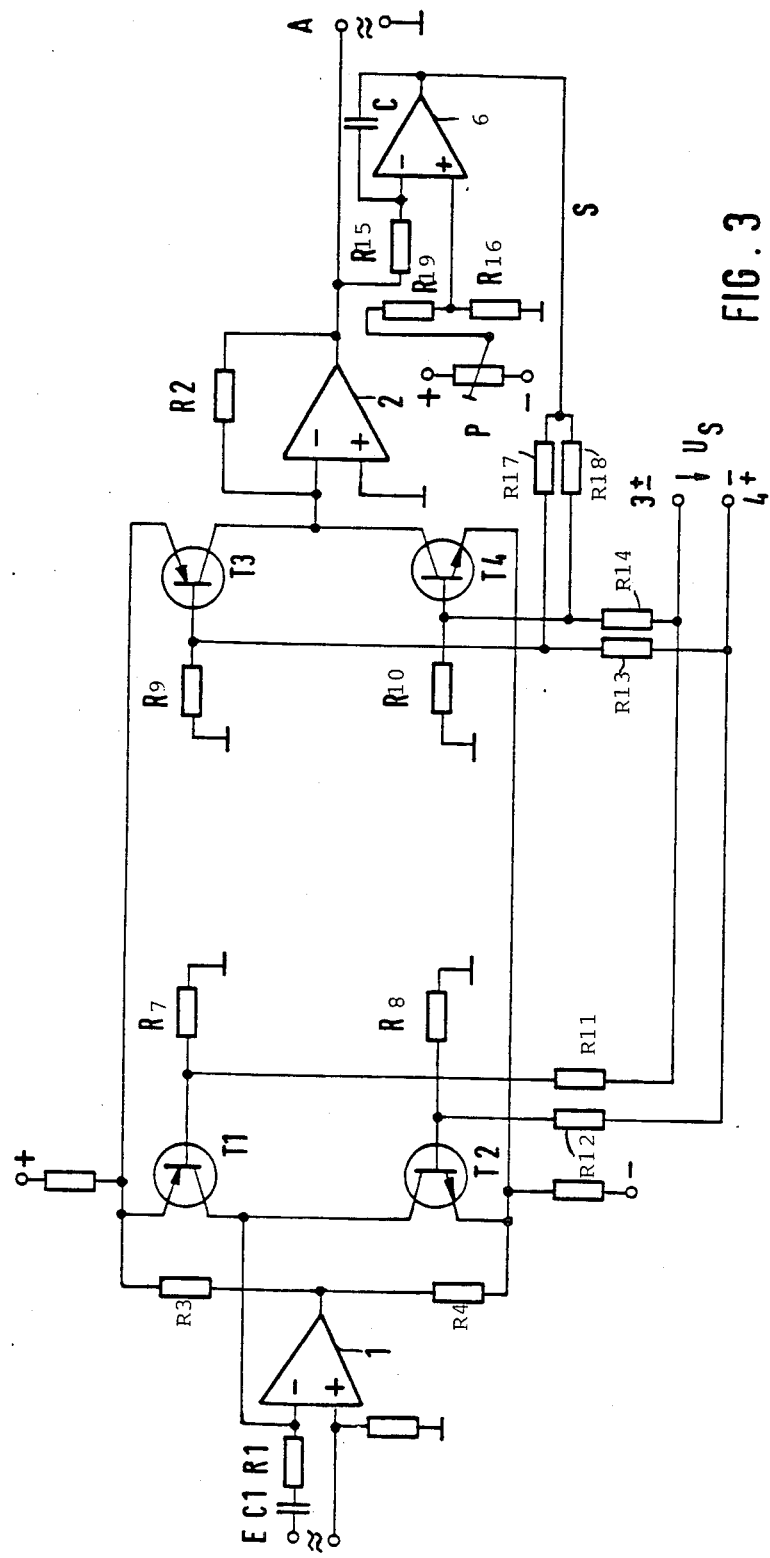
FIG. 3 is a circuit diagram of a voltage controlled amplifier according to the present invention having a compression/expansion function characteristic with controllable gain.

Referring now to FIG. 3, there is shown a preferred embodiment of an amplifier according to the present invention which amplifier generally coincides with that of FIG. 2 with respect to the compressor at the input and its components 1, T1, T2, etc. and with respect to the expander near the output and its components 2, T3, T4, etc. The compressor and expander circuits of FIG. 3 differ, as shown, from the corresponding circuits of FIG. 2 in that the bases of the respective transistor T1-T4 are each connected to ground via respective separate resistors R7-R10 and to the associated terminals 3 or 4 via respective decoupling resistors R11-R14.

In the circuit of FIG. 3, the compressor near the input has an approximately logarithmic compression characteristic and the expander near the output has an approximately exponential expansion characteristic for half-waves of the same polarity. Semiconductor components or transistors T1 to T4 are provided to generate these characteristics. The input coupling capacitor C1 takes care that the input signal to be processed reaches operational amplifier 1 with an arithmetic mean value of zero.

According to the invention at output terminal A there now is disposed a circuit for determining the arithmetic mean of the amplifier output signal. This circuit, which is an integrator, includes an operational amplifier 6 having its inverting input connected via an input resistor R15 to the output terminal A and to its output via a feedback capacitor C. The non-inverting input of operational amplifier 6 is connected to ground via resistor R16. The output of operational amplifier 6 is connected via respective decoupling resistors R17 and R18 to the bases of transistors T3 and T4 so that the output voltage of the integrator is superposed in the same sense on the voltages across the bases of transistors T3, T4. If, for example, a positive half-wave is amplified less than required through T3 and operational amplifier 2, an asymmetrical output voltage appears across output terminals A and a negative direct voltage (control value S) appears at the output of the integrator. This negative control value S will be applied to the bases of transistors T3 and T4, causing transistor T3 to be more conductive and transistor T4 to be less conductive until the asymmetry of the output voltage and the second order distortion have been eliminated.

Preferably, an adjustable desired potential can be applied across the non-inverting input of operational amplifier 6. As shown in FIG. 3, this adjustable desired potential is produced by a potentiometer P having its ends connected across a source of d.c. voltage and having its moveable tap connected via a resistor R19 to the non-inverting input of operational amplifier 6 so that the resistors R16–R19 form a voltage divider. Potentiometer P permits the control circuit 2-6-T3 or T4 to be set to provide minimum second order distortion at output terminal A. At the same time, offset errors of operational amplifiers 2 and 6 can be compensated as well. The reduction to a minimum of the second order distortion output voltages is based on the fact that the control circuit takes care that compansion is effected in the same manner for positive half-waves as for negative half-waves.

Figure 1:
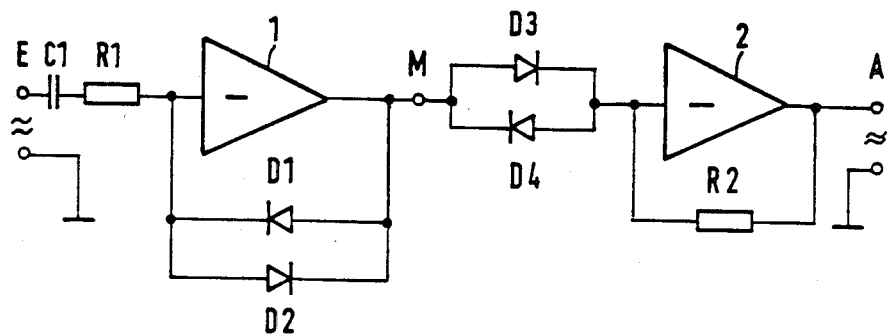
FIG. 1 is a circuit diagram of a voltage controlled amplifier according to the prior art having a compression/expansion function characteristic but without controllable gain.

Additionally, it should be noted that the adjustment voltage Us need not necessarily control the gain of the compressor and of the expander. For example, the compressor could be constructed according to FIG. 1 and thus not be controllable.

$$R_1 = R_2 = 10\ \mu\Omega(1\ \mu\Omega\ldots 100\ \mu\Omega)$$

$$R_7 = R_8 = R_9 = R_{10} = 10\Omega\ldots 1\ \mu\Omega$$

$$R_{11} = R_{12} = R_{13} = R_{14} = 10\cdot R_7\ldots 100\cdot R_7$$

$$R_3 = R_4 = \tfrac{1}{4}\cdot R_1\ldots \tfrac{1}{2}\cdot R_1$$

$$R_{15} = 1\ \mu\Omega(100\ \mu\Omega\ldots 10\ \mu\Omega)$$

$$C = 0{,}22\ \mu F(0{,}1\ \mu F\ldots 1\ \mu F)$$

$$\frac{R_{19}}{R_{16}} = 100$$

It will be understood that the above description of the present invention is susceptible to various modifications, changes and adaptations, and the same are intended to be comprehended within the meaning and range of equivalents of the appended claims.

What is claimed is:

1. An amplifier with a compressor and expander function for positive and negative half-waves of ground symmetrical signals comprising in combination: a signal input terminal; compressor circuit means, having its input connected to said input terminal, for compressing negative and positive half-waves of an input signal; expander circuit means, having its input connected to the output of said compressor circuit means and its output connected to an amplifier output terminal, for expanding positive and negative half-waves of an input signal; circuit means for applying a variable desired voltage to at least one of said expander or compressor circuit means to control the slope of the respective expansion or compression characteristic for at least one half-wave polarity to control the gain of the amplifier; and control circuit means for reducing distortions in the output signal from said amplifier caused by even number harmonics, said control circuit means including means, connected to said output terminal, for determining the arithmetic mean value of the signal at said output terminal and feeding a corresponding control value to said expander or compressor circuit means to change the slope of the expansion or compression characteristic for said at least one half-wave polarity relative to the other half-wave polarity so as to reduce said distortions.

2. An amplifier as defined in claim 1 wherein said control circuit means includes adjustable means for superposing a desired constant value on said corresponding control value.

3. An amplifier as defined in claim 1 wherein: said circuit means for applying a variable voltage is connected to said expander circuit means to control the slope of the expansion characteristic for both half-wave polarities; and said control circuit means feeds said control value to said expander circuit means to simultaneously change the slope of the expansion characteristic for both half-wave polarities.

4. An amplifier as defined in claim 3 wherein said control circuit means comprises an integrator having its input connected to said output terminal and its output connected to said expander circuit means to superpose said control value on said variable desired voltage.

5. An amplifier as defined in claim 4 wherein: said expander circuit means includes first and second opposite polarity type transistors having their respective emitters connected to the output of said compressor circuit means, their collectors connected together and their bases connected via respective resistors to ground, and an operational amplifier having its inverting input connected to the collector of each of said first and second transistors, its non-inverting input connected to ground, and a feedback resistor connected between its output and its said inverting input; said circuit means for applying a variable desired voltage comprises a first terminal for a variable d.c. voltage connected to said base of said first transistor and a second terminal for a variable d.c. voltage connected to the base of said second transistor; and the output of said integrator is connected to the base of each of said first and second transistors via respective decoupling resistors.

6. An amplifier as defined in claim 5 wherein said integrator comprises an operational amplifier having its inverting input connected via a series resistance to said output terminal and via a capacitor to its output, and having its non-inverting input connected to ground via a resistor.

7. An amplifier as defined in claim 6 further comprising means for applying a further desired d.c. voltage to said non-inverting input of said integrator operational amplifier.

8. An amplifier as defined in claim 7 wherein said means for applying a further desired d.c. voltage comprises a potentiometer having its end connected across a source of d.c. voltage and its center tap connected via a resistor to said non-inverting input of said integrator operational amplifier.

9. An amplifier as defined in claim 5 wherein said compressor circuit means includes an input operational amplifier having its inverting input connected in series with a resistor and a capacitor to said input terminal and its non-inverting input connected to ground via a resistor, and third and fourth transistors of the same polarity types as said first and second transistors, respectively, with said third and fourth transistors having their emitters connected respectively to said emitters of said first and second transistors and, via respective resistors, to the output of said input operational amplifier having their collectors connected together and to said inverting input of said input operational amplifier, and having their bases connected to ground via respective resistors; and wherein said first terminal for a variable d.c. voltage is connected to the bases of said first and fourth transistors via respective resistors, and said second terminal for a variable d.c. voltage is connected to the bases of said second and third transistors via respective resistors.

* * * * *